US012639500B2

(12) United States Patent
Kalte et al.

(10) Patent No.: US 12,639,500 B2
(45) Date of Patent: May 26, 2026

(54) METHOD OF ADDING ANOTHER CIRCUIT COMPONENT

(71) Applicant: dSPACE GmbH, Paderborn (DE)

(72) Inventors: Heiko Kalte, Paderborn (DE); Marc Schlenger, Paderborn (DE); Dominik Lubeley, Paderborn (DE)

(73) Assignee: dSPACE GmbH, Paderborn (DE)

( * ) Notice: Subject to any disclaimer, the term of this patent is extended or adjusted under 35 U.S.C. 154(b) by 649 days.

(21) Appl. No.: 17/942,856

(22) Filed: Sep. 12, 2022

(65) Prior Publication Data

US 2023/0082540 A1 Mar. 16, 2023

(30) Foreign Application Priority Data

Sep. 10, 2021 (DE) ...................... 10 2021 123 496.4

(51) Int. Cl.
*G06F 30/347* (2020.01)
*G06F 30/327* (2020.01)

(52) U.S. Cl.
CPC .......... *G06F 30/347* (2020.01); *G06F 30/327* (2020.01)

(58) Field of Classification Search
CPC .... G06F 30/347; G06F 30/327; G06F 30/337; G06F 30/343
See application file for complete search history.

(56) References Cited

U.S. PATENT DOCUMENTS

| | | | | |
|---|---|---|---|---|
| 7,500,060 B1 * | 3/2009 | Anderson | ........... | G06F 12/0875 711/170 |
| 7,793,247 B1 * | 9/2010 | Duthou | .................. | G06F 30/39 716/121 |
| 8,078,357 B1 * | 12/2011 | Trytten | .................. | G06F 9/541 700/95 |
| 2010/0333058 A1 * | 12/2010 | Goodnow | ........ | G01R 31/31718 716/136 |
| 2014/0215424 A1 * | 7/2014 | Fine | ........................ | G06F 30/34 716/117 |
| 2020/0134108 A1 | 4/2020 | Possignolo et al. | | |
| 2021/0256190 A1 | 8/2021 | Kalte et al. | | |

FOREIGN PATENT DOCUMENTS

EP 2793149 A1 10/2014

OTHER PUBLICATIONS

Possignolo et al; "SMatch: Structural Matching for Fast Resynthesis in FPGAs", Designing Interactive Systems conference ACM; Jun. 2, 2019.

* cited by examiner

*Primary Examiner* — Jack Chiang
*Assistant Examiner* — Anwer Ahmed Alawdi
(74) *Attorney, Agent, or Firm* — Muncy, Geissler, Olds & Lowe, P.C.

(57) ABSTRACT

A method of adding another circuit component with operations executable on an FPGA to an FPGA configuration, wherein the FPGA configuration already has at least one existing circuit component with operations executable on the FPGA, which is locally distributed in the FPGA configuration, includes synthesizing the further circuit component to obtain a further netlist, and distributed arranging of the further netlist taking into account the at least one existing circuit component in the FPGA configuration.

16 Claims, 4 Drawing Sheets

Circuit component 5

Circuit component 4

Circuit component 3

Circuit component 2

Circuit component 1

Fig. 1     (Conventional Art)

METHOD OF ADDING ANOTHER CIRCUIT COMPONENT

This nonprovisional application claims priority under 35 U.S.C. § 119(a) to German Patent Application No. 10 2021 123 496.4, which was filed in Germany on Sep. 10, 2021, and which is herein incorporated by reference

BACKGROUND OF THE INVENTION

Field of the Invention

The present invention relates to a method of adding another circuit component with operations executable on an FPGA to an FPGA configuration, wherein the FPGA configuration already has at least one existing circuit component with operations executable on the FPGA, which is locally distributed in the FPGA configuration. The invention further relates to a non-volatile, computer-readable storage medium with commands stored on it, which, when executed on a processor, trigger the method.

Description of the Background Art

An FPGA is an integrated circuit of digital technology into which a logical circuit can be loaded. In contrast to the programming of computers, micro-controllers and controllers, the term "programming" or "building the FPGA" in FPGAs does not only mean specifying temporal sequences, but also defining the desired circuit structure. This circuit structure is formulated using a hardware description language and then translated into a configuration file using software that specifies how the elements should be interconnected in the FPGA. In FPGA programming, a description of the hardware structure is generated, which is then transferred to the actual FPGA with the help of synthesis and routing tools. This hardware description typically takes place in special languages, such as VHDL or Verilog. Instead of "FPGA program", this is also referred to as an "FPGA configuration". In contrast to the programming of computers, microprocessors and controllers, FPGA programming is therefore not aligned with a given operating system and driver base. Instead, FPGA programming aims to define structures in the semiconductor that later perform the intended functions. In this way, a degree of specialization and parallelism can be achieved that is difficult to achieve with conventional, prefabricated microprocessors.

In the field of hardware in the loop simulation (HIL simulation) and rapid control prototyping systems (RCP systems), real-time simulations such as in technical areas of power electronics and electromobility have not been covered by pure processor models for quite some long time. In many applications, such as simulations in which very fast control loops are required, these must be supplemented or even replaced by FPGA models. Such hardware for HIL simulations and rapid control prototyping systems has a large number of FPGAs with tested firmware versions for different functionalities or circuit components, such as FPGAs for communication in a real-time network and FPGAs that can implement different I/O functionalities on I/O channels.

As soon as a change to the functionality is required, the functionality must be reimplemented, the FPGA rebuilt, and every single functionality, i.e., both existing functionalities and the new functionality, must be tested and released. This is because when building the FPGA firmware version, the functionality of each individual circuit component must be optimized across the boundaries of the circuit component, placed on the FPGA and rerouted. Even a change in a single bit or signal can lead to a different result. In this respect, each individual functionality can have a different timing behavior, depending on the placement on the FPGA. The tests required in this way generate a high effort even with only minimal changes, which can range from hardware development to software development to system testing, since the overall functionality of the FPGA must always be tested. This is particularly problematic in hardware development, as the firmware version has to be extensively tested in a climate chamber to guarantee that the firmware version functions under all environmental conditions specified for the product.

SUMMARY OF THE INVENTION

It is therefore an object of the present invention to provide a method for changing a functionality of an FPGA configuration, which is characterized by a low test effort as compared to the methods known from the prior art.

Accordingly, the object is achieved by a method of adding another circuit component with operations executable on an FPGA to an FPGA configuration, wherein the FPGA configuration already has at least one existing circuit component with operations executable on the FPGA, which is locally distributed in the FPGA configuration, comprising the steps: synthesizing the additional circuit component to obtain another netlist, and distributed arranging of the further netlist taking into account the at least one existing circuit component in the FPGA configuration.

An essential point of the proposed method is that, in contrast to the state of the art, only changes to the FPGA configuration have to be tested, but not an overall functionality of the FPGA configuration, which greatly reduces time and cost. In such applications, fixed so-called floorplanning was required in the prior art, in which circuit components were placed in fixed regions, so-called Pblocks, in the FPGA configuration. In contrast, the proposed method allows for the use of, in particular fused, circuit components in variable logic without floorplanning. The method exploits existing free spaces for other circuit components that are created, for example, by customers and not by a manufacturer. An overall timing of the FPGA is not influenced by rigid Pblock constraints and/or circuit components are not set in advance to a fixed Pblock size. This means that the distributed arrangement of the further netlist taking into account the at least one existing circuit component is not limited to a fixed region in the FPGA configuration, as practiced in the prior art. In other words, in contrast to a pure "incremental implementation", so-called component handling is realized.

In summary, the proposed method enables safe operation of fused circuit components in variable FPGA logic, wherein the timing is assured and standard power consumption scenarios are tested, and shorter build times are possible through pre-placement. The method eliminates the need for floorplanning, while creating degrees of freedom for placement and routing tools of the FPGA manufacturer. Furthermore, unused resources are not wasted, since in principle all free spaces that are left can be used. In addition, the method does not require ideal pre-placement of the circuit components and the overall timing is not affected by rigid Pblock constraints. Furthermore, no additional transfer registers to the Pblock constraints are required to avoid timing problems. After all, there is no discarding of many and/or all circuit components if a circuit component becomes too large for its Pblock. In addition, a more uniform distribution of the temperature development is created since no local hotspots are created by extremely active Pblock. The method also allows for the circuit components to be automatically placed close to their I/O. For a climate chamber test, the component functionality can be expanded by an additional heat application, such as switching flip-flops, oscillators without registers, etc., which can heat up the FPGA so that worst case scenarios can be hedged.

The arrangement can include the step of: incremental addition of the further netlist if at least one existing circuit component is blocked.

After arranging, the method can include the step of: removal of the at least one existing circuit component.

Removal can include the steps of: locking the other circuit component, and sequential removal of at least one existing netlist of the at least one existing circuit component.

By means of these steps, a fully placed and routed FPGA configuration can be used as a reference design, wherein in particular all circuit components that also occur in the current design remain identical, but unused circuit components can be automatically removed. Likewise, with the help of the FPGA configuration, a library of fully placed, routed single circuit components can be created, and for all circuit components used in the current design, the finished placement & routing of the single circuit components are assumed from the library for the build.

The method can also include the following steps: locking the other circuit component, and exporting the arrangement of the additional circuit component for consideration when adding yet another circuit component.

In this variant, a so-called constraints library can be created with the help of the FPGA configuration, which contains, in addition to the description of the functionality in a synthesized netlist or a language such as VHDL or Verilog or a graphical modeling of the circuit component, only its constraints. The netlists of all circuit components are not stored fully placed and routed but only the unplaced and unrouted netlists and their constraints, which force an identical place & route.

The method can also include the step of: importing the at least one existing circuit component including the at least one existing netlist, and/or removing unused circuit components from the arrangement of the further circuit component together with at least one existing circuit component.

The arrangement of the further circuit component can be carried out while maintaining an arrangement of the at least one existing circuit component. According to a preferred further development, the arrangement takes place in the free spaces of the FPGA configuration that are unoccupied by the at least one existing circuit component. The FPGA configuration can include a plurality of existing circuit components.

Distributed arranging of the further netlist, taking into account the at least one existing circuit component in the FPGA configuration, in particular locally distributed arranging, means, for example, that the arrangement of each circuit component is not carried out in a dedicated free space, i.e., that each circuit component is thus arranged separately and/or spaced from the other, but instead that the circuit components may overlap geographically. By arranging, the at least one existing circuit component and the other circuit component are placed in the same partitions of the FPGA configuration and/or the at least one existing circuit component and the other circuit component are arranged unpartitioned in the FPGA configuration.

The method can also include the step of: individual testing of the at least one existing circuit component and the other circuit component.

Testing can be carried out in a climate chamber and/or by means of a load generation logic, for example massive flip-flop switching.

A plurality of existing circuit components distributed on the FPGA configuration, taking into account other existing circuit components in each case, can be provided and/or the method includes the step of: arranging a plurality of additional circuit components.

The plurality of other circuit components can be arranged as described above by synthesizing the respective further and distributed arrangement of the respective further netlist. Preferably, the individual circuit components each have different operations executable on the FPGA.

A plurality of existing circuit components distributed under respective consideration of other existing circuit components are provided on the FPGA configuration and the method includes the step of: sequentially removing at least one existing circuit component from the FPGA configuration and replacing the removed circuit component with another version of the circuit component created taking into account all other existing circuit components.

The FPGA configuration can have at least one distributed further circuit component, which is removed sequentially and whose other version is arranged in free spaces, in particular of the removed circuit component, or across all existing free spaces.

For example, an update of a circuit component such as "network" can be effected in an FPGA configuration that is formed of conflict-free circuit components. This is also possible with arbitrarily placed circuit components, which are deleted before the update and placed in newly created free spaces after the update.

The object is further achieved by a non-volatile, computer-readable storage medium with commands stored on it, which trigger a previously described method when executed on a processor.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Modern FPGA tools offer various options for synthesizing, generating netlists, and for implementing, place & route, of FPGAs. During synthesis, the netlists for the circuit components can, for example, be retained in their hierarchy or be de-hierarchized across circuit component boundaries and thus better optimized.

Figure 1:
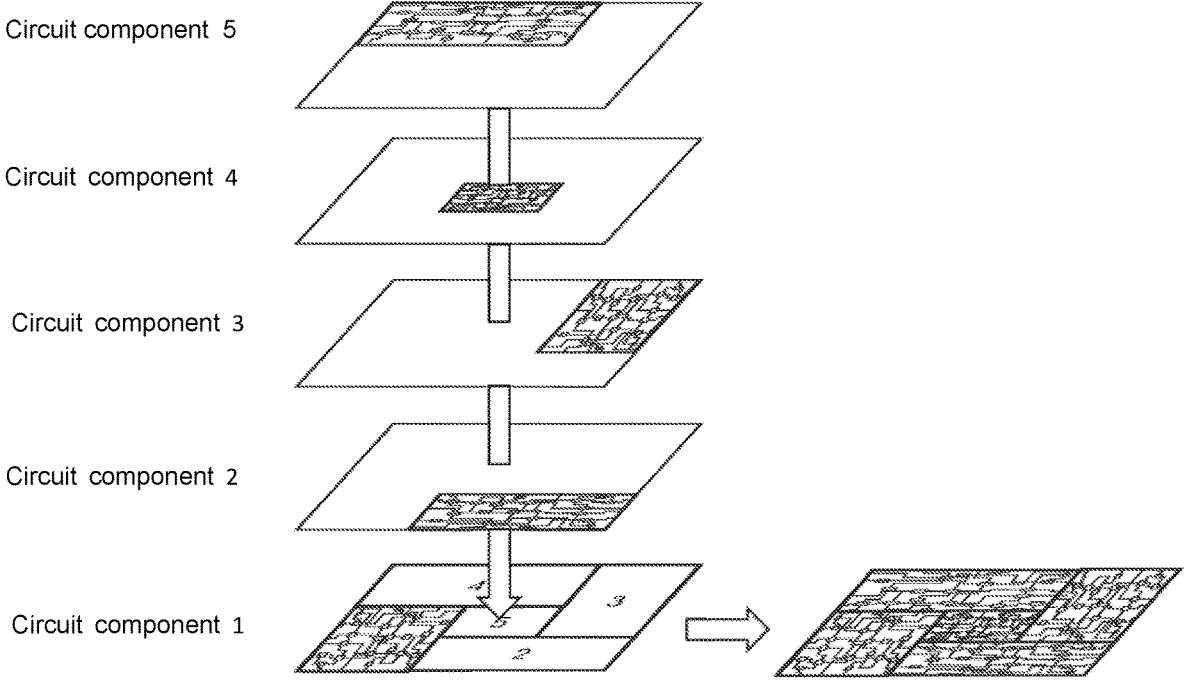
FIG. 1 shows an exemplary application of the conventional art.

FIG. 1 shows an exemplary application, in which a customer, with each build of his customer FPGA configuration, had to also build used existing circuit components, possibly from libraries. Each build resulted in a new optimized netlist, a new placement, and a new routing for existing circuit components that are included in the FPGA bitstream in addition to customer functionality. Libraries in this case are still in a hardware description language such as VHDL, Verilog or in the form of graphical modeling, from which for example VHDL or Verilog is generated with a code generator, possibly with an intermediate step via another language such as C, when high-level synthesis (HLS) tools are used.

Alternatively, floorplanning can divide the area of the FPGA into different regions, called Pblocks, for individual circuit components, as shown in FIG. 1, which can be placed and routed individually. The division into rigid Pblocks also serves as the basis for a dynamic partial reconfiguration in which individual circuit components can be replaced at runtime of the FPGA. A division of the circuit components into different regions is the state of the art method so as to also be able to use existing circuit components firmly placed and routed, with the serious restrictions of floorplanning and Pblocks. Libraries can therefore be as described above and are then placed on a Pblock, so that circuit components are available in the library as netlists fully placed for their Pblock.

The method of a flexible "component stack" described below makes it possible to reduce test efforts and to replace future circuit components installed in customer FPGA applications with newer, secure versions.

In contrast to the previously described approach with floorplanning, the method described below does not require regions of the FPGA to be defined for the individual circuit components. Any circuit component can be placed anywhere in the FPGA. However, the circuit component must not use resources that are already occupied by another circuit component, and it must be selectable as a dedicated stack element. To ensure this, the following three approaches are available, which are explained on the basis of FIG. 2.

Figure 2:
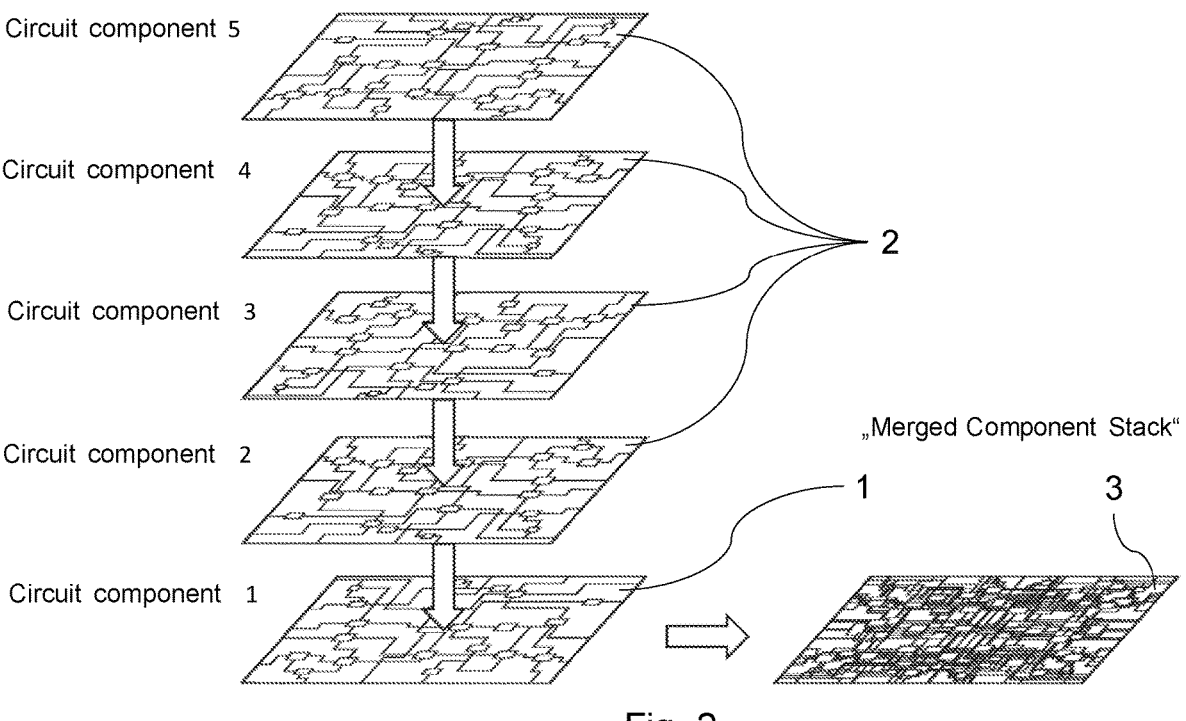
FIG. 2 shows an application according to the proposed method in a schematic view.

FIG. 2 shows another circuit component 1 with operations executable on an FPGA at the bottom left, which is to be inserted into an FPGA configuration 3 in addition to four existing circuit components shown in the upper left corner. The four existing circuit components 2 are arranged locally distributed in the FPGA configuration 3, i.e., not limited to one region of the FPGA. To add them, two basic steps are followed, i.e., first (a) synthesizing the further circuit component 1 to obtain a further netlist of the further circuit component 1, and (b) distributed arranging of the further netlist taking into account the at least one existing circuit component 2 in the FPGA configuration 3.

The arrangement of the further circuit component 1 is carried out while maintaining an arrangement of the at least one existing circuit component 2 in unoccupied free spaces of the FPGA configuration 3. By arranging, the at least one existing circuit component 2 and the further circuit component 1 are placed in the same partitions of the FPGA configuration 3, so that the at least one existing circuit component 2 and the further circuit component 1 are arranged unpartitioned in the FPGA configuration 3.

There are various possibilities for shaping/configuring this method.

In the so-called subtraction method, a fully placed and routed "Merged Component Stack" is used as the reference design, shown schematically as FPGA configuration 3 in FIG. 2 on the right. All circuit components of the "Merged Component Stack", which also occur in a current design, are identically retained; unused circuit components are automatically removed. This method can utilize features of the so-called incremental compilation.

In the so-called addition method, a library of fully placed routed individual circuit components is created with the help of the "Merged Component Stack". For all circuit components used in the current design, the finished placement & routing of the individual circuit components is assumed from the library for the build. This method can utilize features of the so-called hierarchical design flow. From the hierarchical design flow, the locking of already placed and routed circuit components with Pblocks is known. In addition to locking the placement of the cells, LOC constraints, the basic elements, BEL Constraints, used by the cells, and the routing including the setting of the programmable interconnects (PIPs), ROUTE_FIXED constraints, it is also necessary to lock the pins of the basic elements, LOCK_PINS constraints.

The so-called constraints method is the simplest method, since not the circuit components are placed and routed, but only their constraints to force an identical place & route. This method can use the "Merged Component Stack" to create a constraints library that contains—in addition to describing the functionality in a synthesized netlist or a language such as VHDL or Verilog or a graphical modeling of the circuit component—only their constraints.

The creation of a library of circuit components involves the following steps: In the subtraction and addition methods, an incremental addition of the further netlist is carried out when at least one existing circuit component is blocked 2. In the subtraction method, the at least one existing circuit component 2 is then removed, wherein the further circuit component 1 is locked. In the constraints method, the locking of the further circuit component 1 is carried out first, and then the exporting of the arrangement of the further circuit component 1 to be considered when adding yet another circuit component 1. Unused circuit components can be removed from the arrangement of the further circuit component 1 together with the at least one existing circuit component 2.

To create another FPGA circuit component 1, the subtraction method first synthesizes the further circuit component 1, wherein the further circuit component 1 is synthesized as a dedicated out-of-context object, OOC. The synthesis takes place in a defined wrapper so that a netlist path of the further circuit component 1 is always identical. Then, the further netlist of the other further circuit component 1 is exported in order to preserve it as a netlist library. To implement (place & route) the further circuit component 1, it is placed and routed together with a wrapper and all existing circuit components 2. The placement and routing of all existing circuit components 2 is locked and only the new netlist is added incrementally.

The syntax used several times as an example below corresponds to the FPGA tool Xilinx Vivado; it is thus product- and version-bound in its explicity, but sufficiently self-explanatory in its implicity.

read_checkpoint-
incremental<design_of_merged_component_stack>-
fix_reuse
    place_design
    route_design
    As a result, a new FPGA configuration 3 is obtained, in which all existing circuit components 2 including the further circuit component 1 are included.

In the addition method, the further circuit component 1 is first synthesized analogously to the subtraction method and then implemented analogously to the subtraction method. Then, all other circuit components 2 are removed from the placed and routed design by:

Locking the placement and routing of the further circuit component 1.

lock_component<netlist_path_of_component_in_wrapper>

Sequentially removing the netlists of all old circuit components 2.

remove_net<netlist_paths_of_all_other_component_in_wrapper> remove_cell<netlist_paths_of_all_other_component_in_wrapper>

Placing the overall design, preserving the placement of the other circuit components 1 and removing all other unused circuit components because they have no equivalent in the netlist of the design to be placed.

place_design-unplace place_design

Routing the overall design, wherein the routing of the further circuit component 1 is retained and all other unused routes of the circuit components are removed because they have no equivalent in the netlist of the design to be routed.

route_design-unroute route_design

Saving the checkpoint of the further circuit component 1.

With the constraints method, however, the synthesis takes place analogously to the addition and/or subtraction method without netlist export. From a finished design, which can also be formed of several circuit components, for example a "Merged Component Stack", not the complete circuit components, are exported, but only their constraints by:

Locking the placement and routing of the further circuit component 1.

lock_component<netlist_path_of_component_in_wrapper>

Exporting the placement & routing of the further circuit component 1.

write_xdc-type physical-cell<netlist_path_of_component_in_wrapper>component_physical.xdc In order to work with this "(merged) component stack", see FIG. 2 on the right, to simplify also called FPGA configuration 3, in such a way that the existing circuit components 2 can be used as fully placed & routed library elements, not all of which always have to be used in an FPGA, there are three possible approaches in an analogous way:

With the subtraction method, a synthesis including creation of a VHDL code, for example of a customer design or a firmware, takes place first, in which circuit components from the "Merged Component Stack" library can be used as black boxes. The creation can be done using a tool to generate VHDL code from a graphical modeling environment or a high-level language such as C. In VHDL code, only entities, i.e., interface definitions of the circuit components are used, which is done in a specified wrapper so that a netlist path of the circuit component of the component stack is identical. As a result, the individual circuit components are retained in the overall network list but are treated as black boxes.

When performing the synthesis, the netlists of the circuit components used are added from the netlist library of the "Merged Component Stack" so that in a later incremental implementation, the netlist of the "component stack" element of the new design is recognized as identical to the netlist in the "Merged Component Stack" reference. Specifically, for each circuit component, the following is executed individually:

read_checkpoint<synthesized_component_checkpoint_filename>

As part of the implementation, place & route, the entire implemented "Merged Component Stacks" are read in as a reference. Likewise, the netlist of the "merged components stack" is loaded in order to find used circuit components of the "Merged Component Stack" in the netlists of the customer design and/or firmware. For the circuit components used, the existing placement & routing of the reference design ("Merged Component Stack") is used:

read_checkpoint-incremental<design_of_merged_component_stack>-fix_reuse

The overall design is placed while retaining the locked placement of the circuit components of the "Merged Component Stack". Unused circuit components of the "Merged Component Stack" are removed because they have no equivalent in the netlist of the design to be placed:

place_design

The routing of the overall design is carried out while maintaining the routing of the circuit components of the "Merged Component Stack". Routing to non-circuit components of the "Merged Component Stack" is removed because it has no equivalent in the netlist of the design to be routed.

route_design

With the addition method, first the synthesis takes place, analogously to the subtraction method, and then the implementation, place & route. First, the individual required circuit components of the "component stack" are imported. The existing placement & routing is reused for the circuit components used. For each circuit component, the following is executed individually:

read_checkpoint-cell<netlist_path_of_component_in_wrapper> <implemented_component_checkpoint_filename>-strict Then, the placement and routing of the used imported circuit components are locked. For each circuits component, the following is executed individually:

lock_component<netlist_path_of_component_in_wrapper>

The overall design is placed while retaining the placement of the individual circuit components of the "component stack":

place_design

Finally, the routing of the overall design is carried out while retaining the routing of the individual circuit components of the "component stack":

route_design

In the constraints method, the synthesis is first carried out analogously to the addition and subtraction method. During the implementation, place & route, the constraints of the individual required circuit components of the "component stack" are first imported. The existing placement & routing is reused for the circuit components used. For each circuit component, the following is executed individually:

read_xdc component_physical.xdc

Then, the entire design is placed, wherein the placement of the individual circuit components of the "component stack" is forced by the constraints.

place_design

Finally, the overall design is routed, with the constraints forcing the routing of the individual circuit components of the "component stack".

route_design

Figure 3:
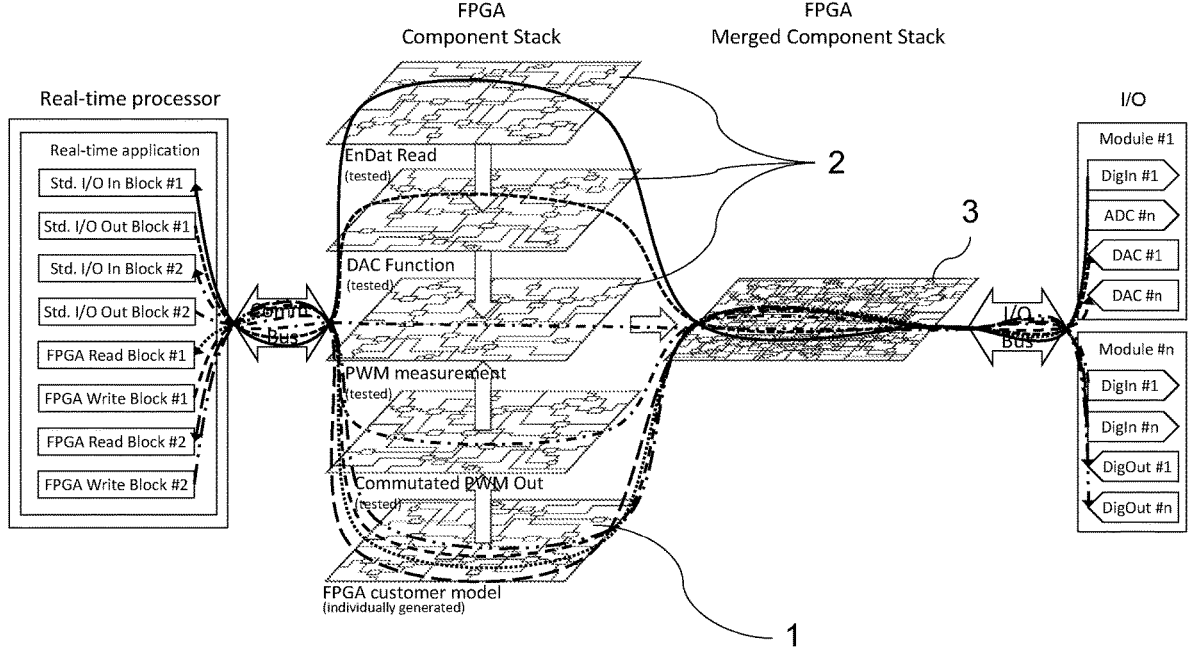
FIG. 3 shows a further example of the application of the proposed method in a schematic view, and FIG. 4 show yet a further example of the application of the proposed method in a schematic view.

By using such a "component stack" as FPGA configuration 3, an operation of fused (firmware) circuit components 1, 2 in variable FPGA logic is possible. New functions with operations that can be performed on the FPGA only need to be tested once and not every time another circuit component 1 is added or an existing circuit component 2 is changed. With the proposed solution, a secure operation of existing circuit components is possible on the basis of the "component stack", for example also "standard I/O" channel functionalities together with, for example, changing customer FPGA logic in an FPGA, as shown in FIG. 3. This optional exclusive use of FPGA I/O channels for, for example, existing standard I/O circuit components/functionality such as a PWM or a resolver functionality, which can thus be provided via a real-time network of a processor of the simulation or simply use of the customer FPGA logic, bears the name "flexible I/O" in dSPACE company products. If I/O channels are used by customers FPGA logic, they are not available for standard I/O components, so these circuit components do not have to be included in the FPGA configuration. For flexible I/O, each standard I/O channel functionality is implemented as a circuit component of the "component stack". Both the addition, the subtraction, and the constraints method can be used.

For example, a customer who graphically models his FPGA model can help build the entire flexible I/O framework for each FPGA build. For example, the framework ensures a connection of the FPGA customer model to the communication bus and I/O and also includes the wrapper between customer model and framework circuit components. If the customer does not address the I/O channels directly from the FPGA model, these channels can be used by standard I/O functions implemented in the FPGA, as indicated in FIG. 3. The standard I/O functions are used by the CPU model on the real-time processor, i.e., not by the FPGA model.

For the FPGA build, in addition to the FPGA model, the netlists of the flexible I/O framework are used. In the framework, the standard I/O channel functionalities for the "component stack"—based synthesis are defined as black boxes. The rest of the framework can still be de-hierarchized and optimized in the synthesis. The implementation runs analogously as described above. In the addition or the constraints method, a constraint is applied for the locking of the placement & routing for the standard I/O functionalities and/or circuit components used in the customer FPGA model.

Figure 4:
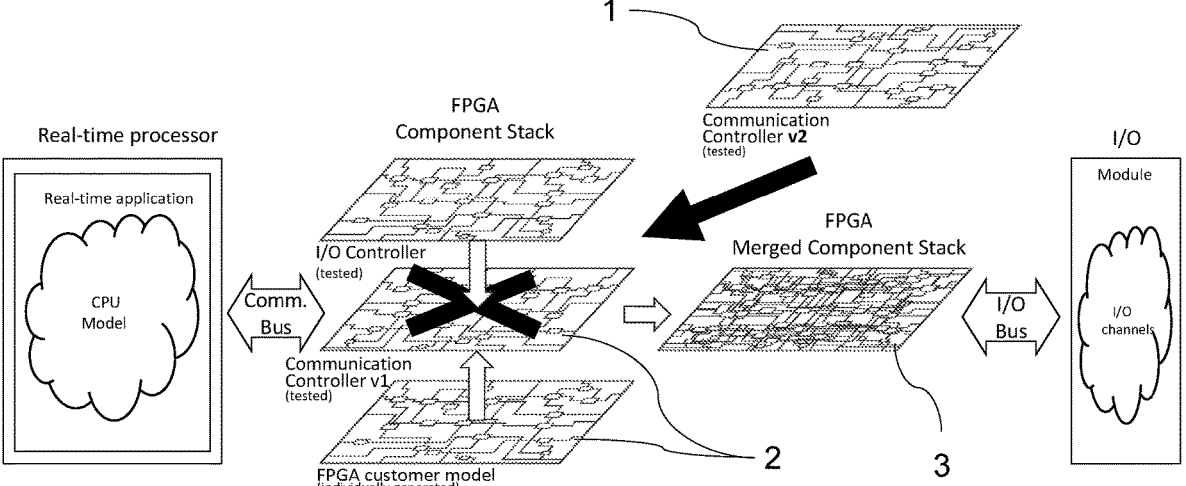

The replacement of a component of the customer FPGA configuration with a tested new version with fixed placement is shown in FIG. 4. The customer logic is newly placed around the secured existing circuit components 2, which ensures the functionality of the further circuit component 1. In the same way, a newer version ("communication controller v2") of a standard I/O channel functionality ("communication controller v1") can be replaced in an FPGA with variable logic, such as in flexible I/O, wherein the replacement can take place with both the addition and the subtraction methods.

The embodiments described are merely examples that can be modified and/or supplemented in the context of the claims in a variety of ways. Each feature described for a particular embodiment can be used independently or in combination with other features in any other embodiment. Any feature that has been described for an embodiment of a particular category can also be used in a corresponding manner in an embodiment of another category.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method of adding another circuit component with operations executable on a field programmable gate array (FPGA) to an FPGA configuration, wherein the FPGA configuration already has at least one existing circuit component with operations executable on the FPGA, which is locally distributed in the FPGA configuration, the method comprising:
   synthesizing the further circuit component to obtain another netlist;
   distributed arranging of the further netlist taking into account the at least one existing circuit component in the FPGA configuration without defining regions in the FPGA for individual components; and
   individually testing the at least one existing circuit component and the further circuit component,
   wherein the arrangement of the further circuit component is carried out while maintaining an arrangement of the at least one existing circuit component.

2. The method according to claim 1, wherein the arranging comprises incrementally adding the further netlist if at least one existing circuit component is blocked.

3. The method according to claim 2, wherein, after arranging, removing the at least one existing circuit component.

4. The method according to claim 3, wherein the removal includes:
   locking the further circuit component; and
   sequential removing at least one existing netlist of the at least one existing circuit component.

5. The method according to claim 1, further comprising:
   locking the further circuit component; and
   exporting the arrangement of the further circuit component for consideration when adding another circuit component.

6. The method according to claim 1, further comprising:
   importing the at least one existing circuit component including the at least one existing netlist; and/or
   removing unused circuit components from the arrangement of the further circuit component together with the at least one existing circuit component.

7. The method according to claim 1, wherein the arrangement takes place in free spaces of the FPGA configuration unoccupied by the at least one existing circuit component.

8. The method according to claim 1, wherein by arranging, the at least one existing circuit component and the further circuit component are placed in the same partitions of the FPGA configuration or the at least one existing circuit component and the further circuit component are arranged unpartitioned in the FPGA configuration.

9. The method according to claim 1, further comprising a plurality of existing circuit components distributed under consideration of other existing circuit components on the FPGA configuration and/or comprising the step of arranging a plurality of further circuit components.

10. The method according to claim 1, further comprising:
   a plurality of existing circuit components distributed under consideration of other existing circuit components on the FPGA configuration; and
   sequentially removing at least one existing circuit component from the FPGA configuration and replacement of the removed circuit component with another version of the circuit component created taking into account all other existing circuit components.

11. The method according to claim 10, wherein the FPGA configuration has at least one distributed further circuit component, which is removed sequentially and whose other version is arranged in free spaces, in particular of the removed circuit component or over all existing free spaces.

12. A non-volatile, computer-readable storage medium with commands stored on it, which, when executed on a processor, trigger a method according to claim 1.

13. The method according to claim 1, wherein by arranging, the at least one existing circuit component and the further circuit component are placed in the same partitions of the FPGA configuration and the at least one existing circuit component and the further circuit component are arranged unpartitioned in the FPGA configuration.

14. The method according to claim 1, wherein said another circuit component does not use resources occupied by said at least one existing circuit component.

15. The method according to claim 1, wherein said another circuit component is selectable as a dedicated stack element.

16. The method according to claim 1, wherein said another circuit component and said at least one existing circuit component are arranged in a merged stack.

* * * * *